(12) United States Patent
Kim et al.

(10) Patent No.: US 9,899,231 B2
(45) Date of Patent: Feb. 20, 2018

(54) HARD MASK COMPOSITION FOR SPIN-COATING

(71) Applicant: Samsung Electronics Co., Ltd., Suwon-si, Gyeonggi-do (KR)

(72) Inventors: Jung-hoon Kim, Hwaseong-si (KR); Nae-ry Yu, Suwon-si (KR); Boo-deuk Kim, Suwon-si (KR); Song-se Yi, Seoul (KR); Jung-sik Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/996,481

(22) Filed: Jan. 15, 2016

(65) Prior Publication Data

US 2016/0211142 A1    Jul. 21, 2016

(30) Foreign Application Priority Data

Jan. 16, 2015   (KR) .................. 10-2015-0008261

(51) Int. Cl.
| | | |
|---|---|---|
| *H01L 21/308* | (2006.01) | |
| *H01L 21/311* | (2006.01) | |
| *G03F 7/40* | (2006.01) | |
| *H01L 21/02* | (2006.01) | |
| *H01L 21/033* | (2006.01) | |
| *G03F 7/11* | (2006.01) | |

(52) U.S. Cl.
CPC .......... *H01L 21/31144* (2013.01); *G03F 7/40* (2013.01); *H01L 21/02115* (2013.01); *H01L 21/02282* (2013.01); *H01L 21/0332* (2013.01); *G03F 7/11* (2013.01)

(58) Field of Classification Search
CPC ......... H01L 21/31144; H01L 21/02115; H01L 21/0332; H01L 21/02282
See application file for complete search history.

(56) References Cited

U.S. PATENT DOCUMENTS

| | | |
|---|---|---|
| 7,981,594 B2 | 7/2011 | Yoon et al. |
| 7,989,145 B2 | 8/2011 | Lee et al. |
| 8,071,485 B2 | 12/2011 | Lee et al. |
| 8,084,366 B2 | 12/2011 | Chan et al. |

(Continued)

FOREIGN PATENT DOCUMENTS

| | | |
|---|---|---|
| JP | 2009-059804 | 3/2009 |
| JP | 2012-077295 | 4/2012 |

(Continued)

OTHER PUBLICATIONS

Xu et al "In situ Polymerization Approach to Graphene-Reinforced Nylon-6 Composites", Macromolecules 2010, vol. 43, pp. 6716-6723.*

(Continued)

*Primary Examiner* — Cynthia Hamilton
(74) *Attorney, Agent, or Firm* — Ward and Smith, P.A.

(57) ABSTRACT

Provided is a hard mask composition for spin-coating, and more particularly, a hard mask composition including a graphene copolymer and a solvent for spin-coating. The hard mask composition according to an exemplary embodiment has an improved etching resistance, and thus, etching with an increased aspect ratio may also be performed on a mask having a smaller thickness.

11 Claims, 8 Drawing Sheets

(56) References Cited

U.S. PATENT DOCUMENTS

| | | | |
|---|---|---|---|
| 8,287,699 B2* | 10/2012 | Zhamu | B82Y 30/00 |
| | | | 204/157.15 |
| 8,445,187 B2 | 5/2013 | Yoon et al. | |
| 8,524,594 B2 | 9/2013 | Horikoshi | |
| 8,846,846 B2 | 9/2014 | Kinsho et al. | |
| 2009/0061329 A1 | 3/2009 | Hirota | |
| 2009/0143515 A1* | 6/2009 | Herrera-Alonso | B01J 20/20 |
| | | | 524/186 |
| 2010/0086463 A1 | 4/2010 | Rudhard et al. | |
| 2011/0052813 A1* | 3/2011 | Ho | B82Y 30/00 |
| | | | 427/256 |
| 2011/0059599 A1* | 3/2011 | Ward | B82Y 30/00 |
| | | | 438/507 |
| 2013/0140495 A1* | 6/2013 | Beall | C01B 31/0446 |
| | | | 252/500 |
| 2014/0106570 A1 | 4/2014 | Someya et al. | |
| 2014/0275323 A1* | 9/2014 | Thibodeau | C09C 1/42 |
| | | | 522/177 |
| 2014/0363768 A1 | 12/2014 | Kinsho et al. | |
| 2015/0284253 A1* | 10/2015 | Zhamu | C01B 31/043 |
| | | | 423/448 |

FOREIGN PATENT DOCUMENTS

| | | |
|---|---|---|
| KR | 1020070074955 A | 7/2007 |
| KR | 100855464 B1 | 8/2008 |
| KR | 1020080107210 A | 12/2008 |
| KR | 1020090057487 A | 6/2009 |
| WO | WO 2012161126 A1 | 11/2012 |

OTHER PUBLICATIONS

Ma et al, RGO functionalised with polyschiff base: multi-chemical sensor for TNT with acidochromic and electrochromic properties , Polym. Chem. 2013, vol. 4, 4746.*

Nikdel et al "Synthesis of poly(2-hydroxyethyl methacrylate-coacrylic acid)-grafted graphene oxide nanosheets via reversible addition-fragmentation chain transfer polymerization" RSC Advances, Published on Mar. 27, 2014. vol. 4, pp. 16743-16750.*

Qi et al ,,"Amphiphilic Graphene Composites" Angew. Chem. Int. Ed. 2010, vol. 49, pp. 9426-9429.*

Rangarajan, A"Graphen Etch Mask for Silicon," Thesis submitted for masters degree, University of Illinoius at Urvana-CHampaign, 2024, 38 pages obtained from application of US 20160268128.*

Zhang et al, Biosensors and Bioelectronics 26 (2010) pp. 371-376.*

"hydroxylamine", CAS Registry No. 7803-49-8, from SciFinder database, American Chemical Society downloaded Jun. 17, 2017.*

Ma et al. "Photoelectrochemical and electrochromic properties of polyimide/grapheme oxide composites", *Carbon* 67:488-499 (2014).

* cited by examiner

HARD MASK COMPOSITION FOR SPIN-COATING

CROSS-REFERENCE TO RELATED APPLICATION

This application claims the benefit of and priority to Korean Patent Application No. 10-2015-0008261, filed on Jan. 16, 2015, in the Korean Intellectual Property Office, the disclosure of which is incorporated herein by reference in its entirety.

FIELD OF THE INVENTIVE CONCEPT

The inventive concept relates to a hard mask composition for spin-coating, and more particularly, a hard mask composition for spin-coating having an improved etching resistance, which allows etching with an increased aspect ratio on a mask having a smaller thickness.

BACKGROUND

With the miniaturization of electronic appliances, semiconductor devices have been downscaled. Further, line widths are also decreasing, and aspect ratios of structures have increased as well in line with such changes. Furthermore, absolute depths for etching have also increased, and there is generally a need for a thicker hard mask suitable for such etching depths.

SUMMARY

The inventive concept provides a hard mask composition for spin-coating having a greater etching resistance, which allows etching with an increased aspect ratio on a mask having a smaller thickness.

The inventive concept provides a method of forming a hard mask composition having a greater etching resistance, which allows etching with an increased aspect ratio on a mask having a smaller thickness.

The inventive concept provides a method of forming a pattern on a hard mask composition having a greater etching resistance, which allows etching with an increased aspect ratio on a mask having a smaller thickness.

According to an aspect of the inventive concept, there is provided a hard mask composition for spin-coating including a graphene copolymer and a solvent. The graphene copolymer may include a graphene repeating unit and an aromatic repeating unit.

The graphene copolymer may include a structure of Formula 1:

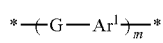

<Formula 1> wherein, G indicates the graphene repeating unit, $Ar^1$ indicates the aromatic repeating unit, and m is an integer of about 10 to about 10000, about 50 to about 6000 or about 100 to 4000.

The aromatic repeating unit may be selected from a pyrene derivative, a naphthalene derivative, an anthracene derivative, a phenanthrene derivative, a fluorene derivative, a phthalic anhydride derivative, a naphthacene derivative, a fluoanthracene derivative, a tetraphene derivative, a perylene derivative, a chrysene derivative, a dibenzoanthracene derivative, a pentaphene derivative, a coronene derivative, a pentacene derivative, a hexacene derivative, an antanthrene derivative, an ovalene derivative, a pyranthrene derivative, an acenaphthene derivative, an acenaphthylene derivative, a fluoranthene derivative, a fluoranthene derivative, and a triphenylene derivative.

At least two aromatic repeating units may be present between two graphene repeating units. The graphene copolymer may include a structure of Formula 2:

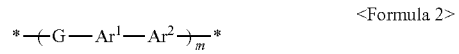

<Formula 2> wherein, G indicates the graphene repeating unit, $Ar^1$ and $Ar^2$ each indicate the aromatic repeating unit, and m is an integer of about 10 to about 10000, about 50 to about 6000 or about 100 to 4000.

The graphene copolymer may be a condensation polymerization product of a first monomer including the graphene repeating unit and a second monomer including the aromatic repeating unit. The graphene copolymer may include at least one bond selected from an ester group, an amide group, a urethane group (—NHCOO—), a urea group (—NHCONH—), an imide group, and a hydroxyether group.

The hard mask composition for spin-coating may further include a reducing agent. The reducing agent may be selected from a boron hydride metal salt, an aluminum hydride, a $C_2$ to $C_6$ glycol, an alkanolamine, an aliphatic amine, a heterocyclic amine, an aromatic amine, an aralkyl amine, an alcohol, an organic acid, reducing sugars, sugar alcohols, a hydrazine compound, a sulfite, a glutathione, dextrin, and a hydroquinone.

The hard mask composition for spin-coating may further include a cross-linking agent. The cross-linking agent may be selected from an isocyanate-based cross-linking agent, a peroxide-based cross-linking agent, an epoxy-based cross-linking agent, and an amine-based cross-linking agent.

The solvent may be selected from propylene glycol monomethyl ether acetate (PGMEA), propylene glycol monomethyl ether (PGME), propylene glycol propyl ether (POPE), cyclohexanone, N-methyl-2-pyrrolidone (NMP), γ-butyrolactone (GBL), 2-hydroxyisobutyric acid methylester (HBM), dimethyl sulfoxide (DMSO), and ethyl lactate (EL).

The graphene copolymer may further include a surfactant.

According to another aspect of the inventive concept, there is provided a method of forming a hard mask material film including: preparing a hard mask composition for spin-coating including a graphene copolymer and a solvent; forming a layer of the hard mask composition on a substrate; and reducing the layer of the hard mask composition.

The forming of the layer of the hard mask composition may include spin-coating the substrate with the hard mask composition.

Reducing the layer of the hard mask composition may include thermal-treating the layer of the hard mask composition at a temperature of about 300° C. to about 800° C. in a reducing atmosphere.

In the method of forming a hard mask material film, the hard mask composition for spin-coating may further include a reducing agent, and reducing the layer of the hard mask composition may include thermal-treating the layer of the hard mask composition at about 300° C. to about 800° C. In addition, the hard mask composition for spin-coating may further include a cross-linking agent, and cross-linking may occur during thermal-treating by the cross-linking agent.

The hard mask material film may be amorphous.

According to another aspect of the invention, there is provided a process for spin-coating including applying to a substrate a hard mask composition including a graphene copolymer and a solvent. The graphene copolymer may include a structure of Formula 1:

<Formula 1> wherein, G indicates a graphene repeating unit, $Ar^1$ indicates a aromatic repeating unit, and m is an integer of about 10 to about 10000, about 50 to about 6000 or about 100 to 4000.

The graphene copolymer may include a structure of Formula 2:

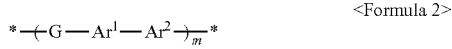

<Formula 2> wherein, G indicates the graphene repeating unit, $Ar^1$ and $Ar^2$ each indicate the aromatic repeating unit, and m is an integer of about 10 to about 10000, about 50 to about 6000 or about 100 to 4000.

According to another aspect of the inventive concept, there is provided a method of forming a pattern including: providing a substrate including a to be etched or etchable material film; forming a hard mask material film including a graphene copolymer on the to-be-etched material film of the substrate; forming a photoresist pattern on the hard mask material film; patterning the hard mask material film using the photoresist pattern as an etch mask to form a hard mask pattern; and patterning the to be etched material film using the hard mask pattern as an etch mask.

The method of forming the pattern may further include forming a silicon oxynitride film on the hard mask material film before forming the photoresist pattern. The pattern formed during the patterning of the to-be-etched material film may have an aspect ratio in a range of about 20 to about 70.

The pattern may be a channel hole of a vertical NAND or a contact hole for forming a capacitor.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
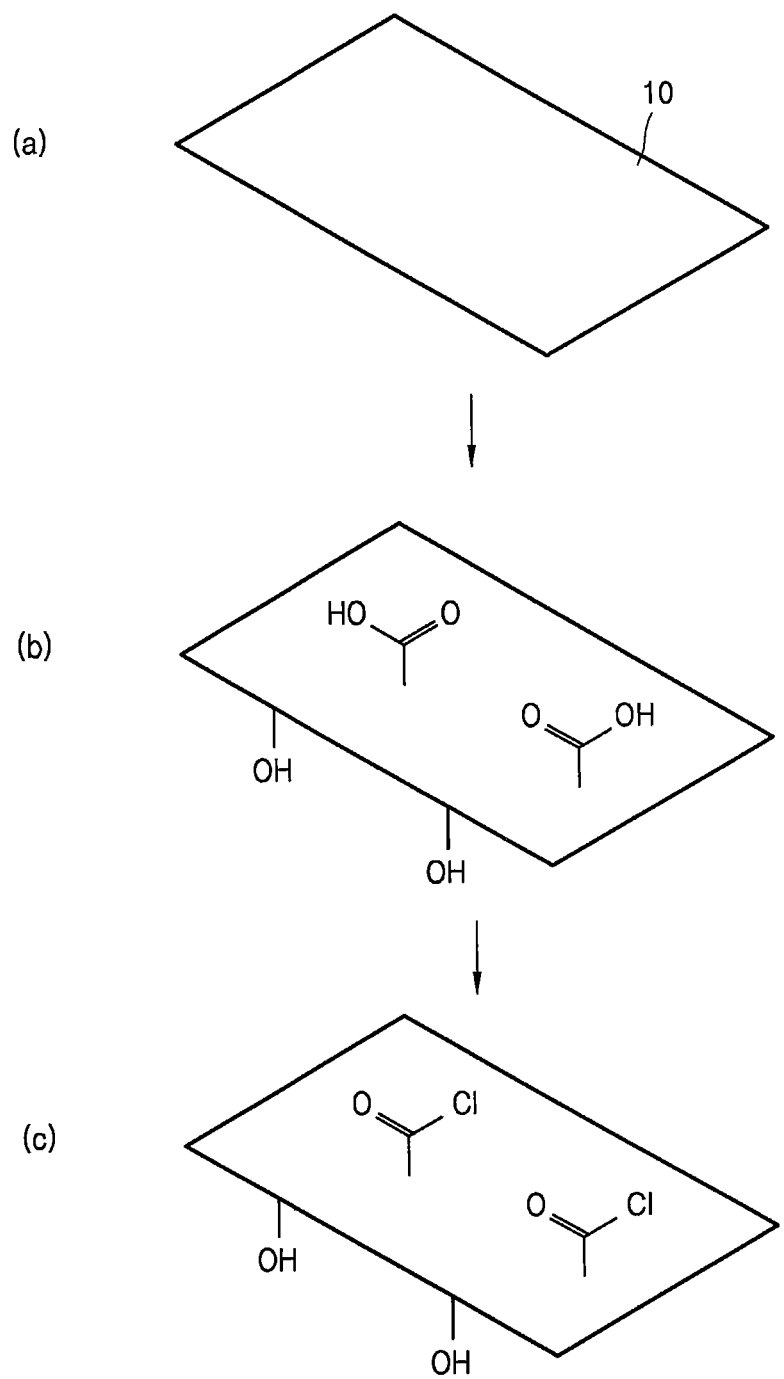
FIG. 1 illustrates a process of forming functional groups on a surface of a graphene sheet.

Hereinafter, the inventive concept will be described more fully with reference to the accompanying drawings, in which exemplary embodiments of the inventive concept are shown. The inventive concept may, however, be embodied in many different forms and should not be construed as being limited to the embodiments set forth herein; rather these embodiments are provided so that this disclosure will be thorough and complete, and will fully convey the inventive concept to one of ordinary skill in the art. In the drawings, like reference numerals denote like elements. Further, the regions illustrated in the figures are schematic in nature. Their shapes may be not intended to illustrate the actual shape of a region of a device and are not intended to limit the scope of exemplary embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments.

The terms used herein may be used to describe exemplary embodiments, and the inventive concept should not be limited by these terms. As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of at least one certain characteristic, number, operation, constituent element, or a combination thereof. As used herein, the transitional phrase "consisting essentially of" means that the scope of a claim is to be interpreted to encompass the specified materials or steps recited in the claim, "and those that do not materially affect the basic and novel characteristic(s)" of the claimed invention. See, In re Herz, 537 F.2d 549, 551-52, 190 U.S.P.Q. 461, 463 (CCPA 1976) (emphasis in the original); see also MPEP §2111.03. Thus, the term "consisting essentially of" when used in a claim of this invention is not intended to be interpreted to be equivalent to "comprising."

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present.

Unless defined otherwise, all terms used herein including technical or scientific terms have the same meanings as those generally understood by those of ordinary skill in the art to which the inventive concept may pertain. The terms as those defined in generally used dictionaries are construed to have meanings matching that in the context of related technology and, unless clearly defined otherwise, are not construed to be ideally or excessively formal. All publications, patent applications, patents, and other references mentioned herein are incorporated by reference in their entirety.

Embodiments of the present inventive concept include a hard mask composition for spin-coating that may include a graphene copolymer and a solvent.

The hard mask composition may be dissolved to have a viscosity that allows the graphene copolymer to be spin coated.

[Hard Mask Composition]

{Graphene Copolymer}

The graphene copolymer may have a graphene repeating unit and an aromatic repeating unit. The graphene repeating unit may have graphene as a main moiety, and the aromatic repeating unit may have a benzene ring or a fused benzene ring as a main moiety.

The graphene copolymer may have a structure as in Formula 1:

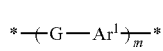

<Formula 1> wherein, G indicates the graphene repeating unit, $Ar^1$ indicates the aromatic repeating unit, and m is an integer selected from about 10 to about 10000, about 50 to about 6000, and about 100 to about 4000.

The graphene repeating unit (G) consists of several carbon atoms bound to each other two-dimensionally in a honeycomb-shaped structure. A functional group may be bound to some carbon atoms among the several carbon atoms forming graphene, and the functional group may react with another functional group of a monomer having the aromatic repeating unit, thereby forming a copolymer having an identical structure to Formula 1.

The molecular weight of the graphene is not particularly limited. For example, the weight-average molecular weight of the graphene may be in a range of about 500 to about 200000, about 800 to about 100,000 or about 1000 to about 30000.

The aromatic repeating unit may be at least one selected from a pyrene derivative, a naphthalene derivative, an anthracene derivative, a phenanthrene derivative, a fluorene derivative, a phthalic anhydride derivative, a fluoanthracene derivative, a perylene derivative, a chrysene derivative, a coronene derivative, a pentacene derivative, a hexacene derivative, an antanthrene derivative, an ovalene derivative, and a pyranthrene derivative, and may include a moiety selected from a structure of Formulae 3 to 37:

<Formula 3>

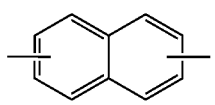

Naphthalene derivative

<Formula 4>

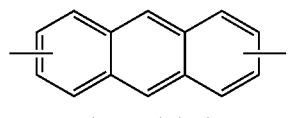

anthracene derivative

<Formula 5>

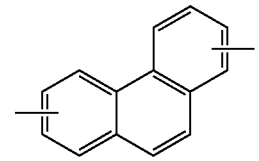

penanthrene derivative

<Formula 6>

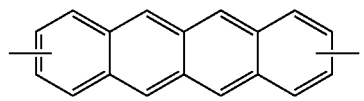

naphthacene derivative

<Formula 7>

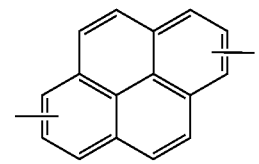

pyrene derivative

<Formula 8>

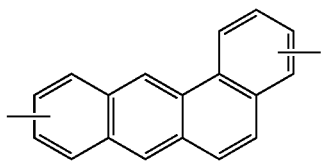

tetraphene derivative

<Formula 9>

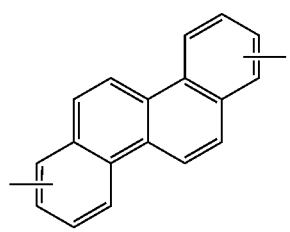

chrysene derivative

<Formula 10>

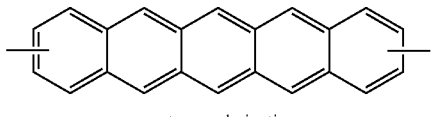

pentacene derivative

<Formula 11>

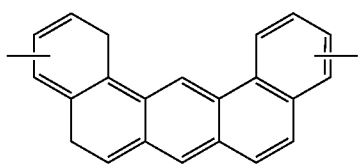

dibenzoanthracene derivative

<Formula 12>

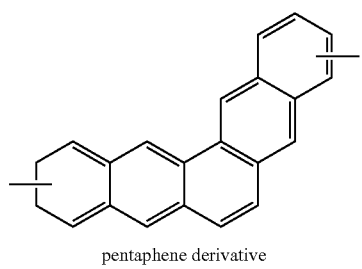

pentaphene derivative

<Formula 13>

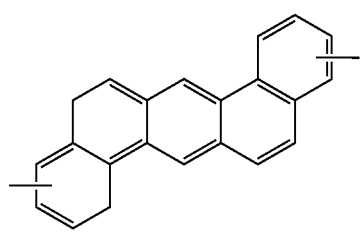

dibenz[a,h]anthracene derivative

<Formula 14>

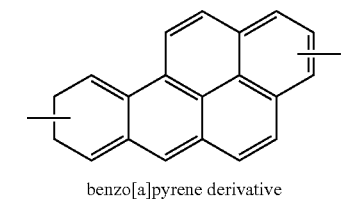

benzo[a]pyrene derivative

<Formula 15>

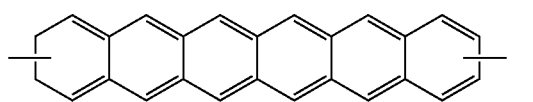

hexacene derivative

<Formula 16>

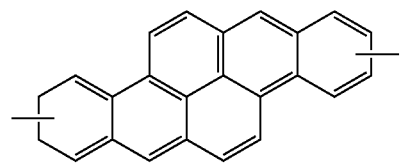

dibenz[a,h]pyrene derivative

<Formula 17>

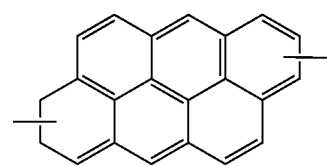

antanthrene derivative

<Formula 18>

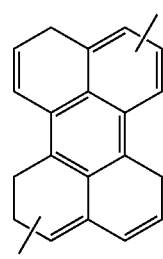

perylene derivative

<Formula 19>

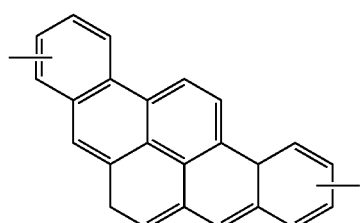

dibenz[a,i]pyrene derivative

<Formula 20>

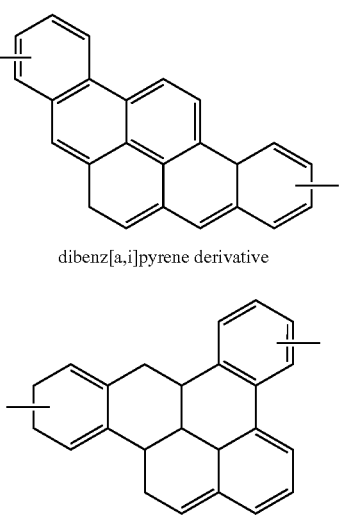

dibenz[a,e]pyrene derivative

<Formula 21>

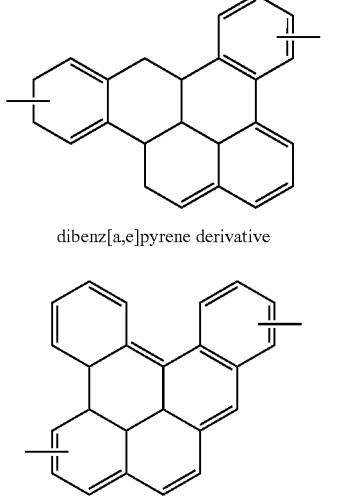

dibenz[a,l]pyrene derivative

<Formula 22>

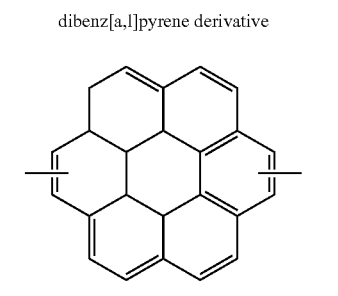

coronene derivative

<Formula 23>

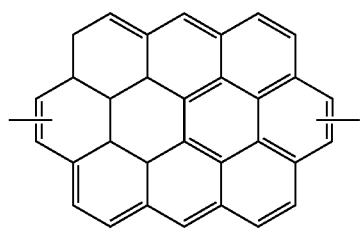

ovalene derivative

<Formula 24>

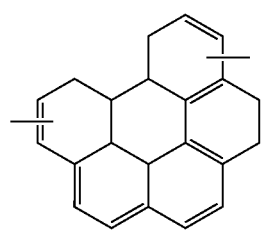

benzo[g,h,i]perylene derivative

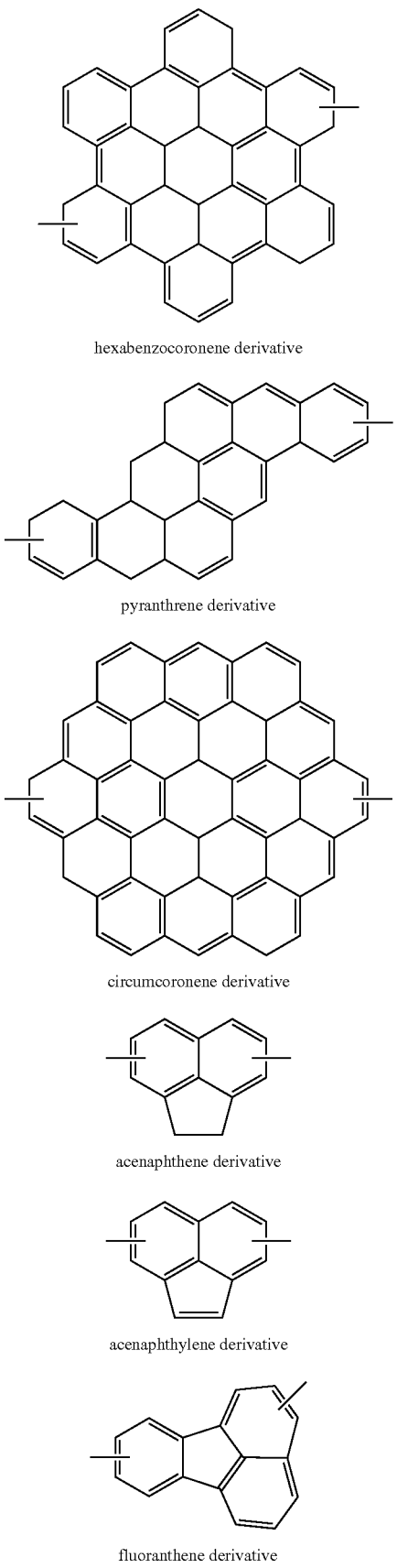

hexabenzocoronene derivative pyranthrene derivative circumcoronene derivative acenaphthene derivative acenaphthylene derivative fluoranthene derivative <Formula 25>

<Formula 26>

<Formula 27>

<Formula 28>

<Formula 29>

<Formula 30>

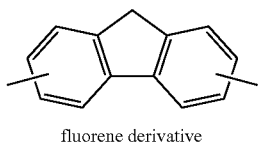

fluorene derivative

<Formula 31>

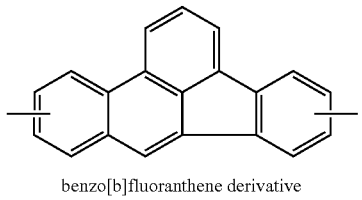

benzo[b]fluoranthene derivative

<Formula 32>

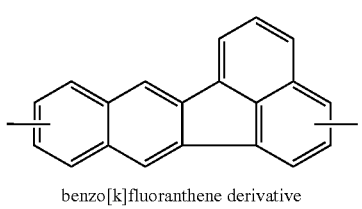

benzo[k]fluoranthene derivative

<Formula 33>

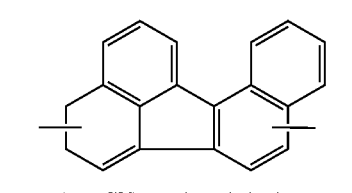

benzo[j]fluoranthene derivative

<Formula 34>

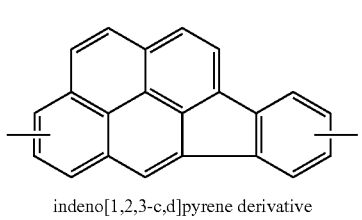

indeno[1,2,3-c,d]pyrene derivative

<Formula 35>

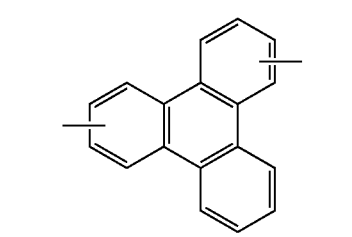

triphenylene derivative

<Formula 36>

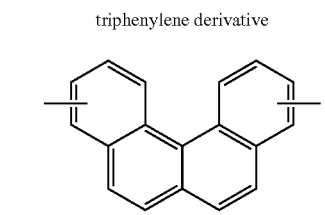

benzo[c]phenanthrene derivative

<Formula 37>

Further, moieties of the graphene repeating unit and the aromatic repeating unit may be bound to each other via a bond formed by condensation polymerization. For example, moieties of the graphene repeating unit and the aromatic repeating unit may be bound to each other via at least one bond selected from an ester group, an amide group, a urethane group (—NHCOO—), a urea group (—NHCONH—), an imide group, and hydroxyether group. However, embodiments are not limited thereto.

Examples of pairs of functional groups that may undergo condensation polymerization are as shown in [Reaction Scheme 1] below.

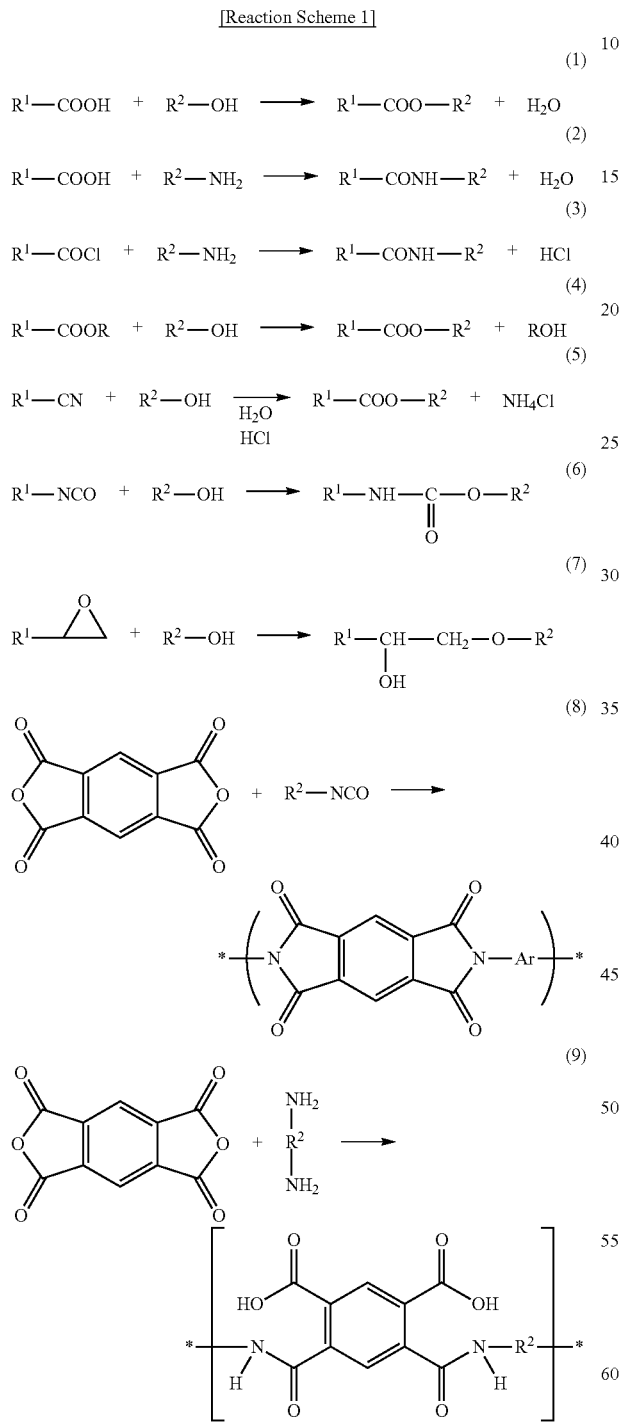

wherein, $R^1$ and $R^2$ may be each independently one moiety of multiple moieties of the graphene repeating unit and the aromatic repeating unit. However, embodiments are not limited to the functional groups in Reaction Scheme 1.

Specifically, as described in Reaction Scheme 1, when a COOH functional group is bound to the graphene repeating unit, and an OH functional group is bound to a pyrene, which is the aromatic repeating unit, the reactants may react, thereby forming a —COO— bond and bonding to each other.

In addition, when forming a polymer having a high degree of polymerization, in which the polymer is polymerized by several monomers, a monomer may essentially have at least two functional groups, which allow reactions with two other monomers, leading to the growth of a chain. Accordingly, the graphene repeating unit may have at least two functional groups, and moieties of the aromatic repeating unit may also have at least two functional groups.

A graphene copolymer, according to an exemplary embodiment, may have at least two aromatic repeating units present among the graphene repeating units. In other words, the graphene copolymer may have a structure of Formula 2:

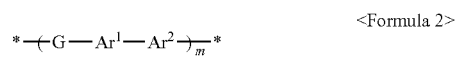

<Formula 2> wherein, G indicates the graphene repeating unit, $Ar^1$ and $Ar^2$ each indicate the aromatic repeating unit, and m is an integer selected from about 10 to about 10000, about 50 to about 6000, and about 100 to about 4000.

Descriptions of the aromatic repeating units have been provided above. In addition, regarding the aromatic repeating units, the aromatic repeating units $Ar^1$ and $Ar^2$ may be identical to or different from each other.

When the graphene copolymer is constituted as above, the distance between neighboring graphene repeating units may increase, thereby improving solubility thereof in the solvent. Further, when forming a material film, the graphene copolymer may be deposited more randomly, thereby obtaining a more amorphous material film.

However, embodiments are not limited thereto, and the graphene copolymer may include at least three aromatic repeating units among the graphene repeating units.

{Hard Mask Composition}

The graphene copolymer may be dissolved in a solvent. The solvent may be an organic solvent rather than an aqueous solvent. For example, the solvent may be selected from a glycol, propylene glycol, ethylene glycol, propylene glycol monomethyl ether acetate (PGMEA), propylene glycol monomethyl ether (PGME), propylene glycol propyl ether (POPE), cyclohexanone, N-methyl-2-pyrrolidone (NMP), γ-butyrolactone (GBL), 2-hydroxyisobutyric acid methylester (HBM), dimethyl sulfoxide (DMSO), ethyl lactate (EL), and a mixture thereof.

The ratio of the solvent in the total amount of the hard mask composition may be in a range of about 90 wt % to about 99 wt %.

The hard mask composition may further include the following components.

Reducing Agent

The hard mask composition requires a reduction process in order to increase the fraction of sp2 carbon. Therefore, the hard mask composition may further include a reducing agent. Examples of the reducing agent may include boron hydride metal salts, such as sodium boron hydride and potassium boron hydride; aluminum hydride salts, such as lithium aluminum hydride, potassium aluminum hydride, cesium aluminum hydride, beryllium aluminum hydride, magnesium aluminum hydride, and calcium aluminum hydride; $C_2$ to $C_6$ glycols, such as ethyleneglycol; alkanolamines, such as diethylaminoethanol, ethanol amine, propanol amine, triethanol amine, and dimethylaminopropanol; aliphatic amines, such as propylamine, butylamine, dipropyleneamine, ethylenediamine, and triethylenepentamine; heterocyclic amines such as piperidine, pyrrolidine, N-methylpyrrolidine, and morpholine; aromatic amines, such as aniline, N-methyl aniline, toluidine, anisidine, and phenetidine; aralkylamines, such as benzylamine, xylenediamine, and N-methylbenzylamine; alcohols, such as methanol, ethanol, and 2-propanol; organic acids, such as citric acid, malic acid, succinic acid, oxalic acid, and tartaric acid; reducing sugars, such as glucose, galactose, mannose, fructose, sucrose, maltose, raffinose, and stachyose; and sugar alcohols, such as sorbitol. In addition, the reducing agent may be a hydrazine compound, sulfite, glutathione, dextrin, hydroquinone, or hydroxylamine. However, embodiments are not limited thereto.

Surfactant

The hard mask composition may further include a surfactant in order to increase uniformity of the thickness of the formed material film.

The surfactant may be a non-ionic surfactant, a cationic surfactant, an anionic surfactant, and an ampholytic surfactant.

Examples of the non-ionic surfactant include polyoxyethylene alkyl ethers, such as polyoxyethylene lauryl ether and polyoxyethylene stearyl ether; polyoxyethylene alkylphenylethers, such as polyoxyethylene octyl phenyl ether and polyoxyethylene nonyl phenylether; sorbitan esters of higher fatty acids, such as sorbitan monolaurate, sorbitan monostearate, and sorbitan trioleate; polyoxyethylene sorbitan esters of higher fatty acids, such as polyoxyethylene sorbitan monolaurate; polyoxyethylene esters of higher fatty acids, such as polyoxyethylene monolaurate and polyoxyethylene monostearate; glycerine esters of higher fatty acids, such as oleic acid monoglyceride and stearic acid monoglyceride; polyoxyalkylenes, such as polyoxyethylene, polyoxypropylene, and polyoxybutylene; and block copolymers thereof.

Examples of the cationic surfactant may include alkyl trimethyl ammonium chloride, dialkyl dimethyl ammonium chloride, benzalkonium chloride salt, and alkyl dimethyl ammonium ethosulfate.

Examples of the anionic surfactant may include carboxylic acid salts, such as lauric acid sodium, oleic acid sodium, N-acyl-N-methyl glycine sodium salt, and sodium polyoxyethylene lauryl ether carboxylate; sulfonic acid salts, such as sodium dodecylbenzenesulfonic acid, dialkyl sulfosuccinic acid ester salt, and dimethyl-5-sulfoisophthalate sodium; sulfate ester salts, such as sodium lauryl sulfate, sodium polyoxyethylene lauryl ether sulfate, and sodium polyoxyethylene nonyl phenylether sulfate; phosphate ester salts, such as sodium polyoxyethylene lauryl phosphate, sodium polyoxyethylene nonyl phenyl ether phosphate.

Examples of the ampholytic surfactant may include a carboxybetaine type surfactant, an amino carboxylic acid salt, imidazolinium betaine, lecithin, and an alkylamine oxide.

Cross-Linking Agent

The hard mask composition may further include a cross-linking agent in order to improve the etching resistance of the material film. The cross-linking agent may be at least one selected from an isocyanate-based cross-linking agent, a peroxide-based cross-linking agent, an epoxy-based cross-linking agent, and an amine-based cross-linking agent.

Compounds related to the isocyanate-based cross-linking agent may include isocyanate monomers, such as tolylene diisocyanate, chloro phenylene diisocyanate, tetramethylene diisocyanate, xylylene diisocyanate, diphenyl methane diisocyanate, hydrogen added diphenyl methane diisocyanate; an isocyanate compound in which the isocyanate monomers are combined with trimethylol propane; an isocyanurate compound; a biuret-type compound; and, urethane prepolymer type isocyanates in which polyether polyol, polyester polyol, acryl polyol, polybutadiene polyol, or polyisoprene polyol is added. In particular, the isocyanate-based cross-linking agent may be a polyisocyanate compound including at least one selected from hexamethylene diisocyanate, hydrogen-added xylylene diisocyanate, and isophorone diisocyanate or a compound originated from the polyisocyanate compound.

Examples of the peroxide-based cross-linking agent may include di(2-ethylhexyl) peroxydicarbonate, di(4-t-butylcyclohexyl) peroxydicarbonate, di-sec-butylperoxy dicarbonate, t-butylperoxy neodecanoate, t-hexylperoxy pivalate, t-butylperoxy pivalate, dilauroyl peroxide, di-n-octanoyl peroxide, 1,1,3,3-tetramethyl butylperoxy-2-ethyl hexanoate, di(4-methylbenzoyl) peroxide, dibenzoyl peroxide, t-butylperoxy isobutyrate, and 1,1-di(t-hexylperoxy) cyclohexane.

Examples of the epoxy-based cross-linking agent may include N,N,N',N'-tetraglycidyl-m-xylene diamine, diglycidyl aniline, 1,3-bis(N,N-glycidyl aminomethyl) cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylol propane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether.

Examples of the amine-based cross-linking agent may include compounds having a plurality of amino groups, such as ethylene diamines. Examples of the ethylene diamines may include ethylene diamine, 1,2-diamino propane, 1,2-diamino-2-methyl propane, N-methyl ethylene diamine, N-ethyl ethylene diamine, N-isopropyl ethylene diamine, N-hexyl ethylene diamine, N-cyclohexyl ethylene diamine, N-octyl ethylene diamine, N-decyl ethylene diamine, N-dodecyl ethylene diamine, N,N-dimethyl ethylene diamine, N,N-diethyl ethylene diamine, N,N'-diethyl ethylene diamine, N,N'-diisopropyl ethylene diamine, N,N,N'-trimethyl ethylene diamine, diethylene triamine, N-isopropyl diethylene triamine, N-(2-aminoethyl)-1,3-propane diamine, triethylene tetramine, N,N'-bis(3-aminopropyl) ethylene diamine, N,N'-bis(2-aminoethyl)-1,3-propane diamine, tris(2-amino ethyl) amine, tetraethylene pentamine, pentaethylene hexamine, 2-(2-aminoethylamino)ethanol, N,N'-bis (hydroxyethyl) ethylene diamine, N-(hydroxyethyl) diethylene triamine, N-(hydroxyethyl) triethylene tetramine, piperazine, 1-(2-amino ethyl) piperazine, 4-(2-aminoethyl) morpholine, and polyethyleneimine. Examples of diamines and polyamines that may be applicable other than ethylene diamines may include 1,3-diamino propane, 1,4-diamino butane, 1,3-diamino pentane, 1,5-diamino pentane, 2,2-dimethyl-1,3-propane diamine, hexamethylene diamine, 2-methyl-1,5-diamino propane, 1,7-diamino heptane, 1,8-diamino octane, 2,2,4-trimethyl-1,6-hexane diamine, 2,4,4-trimethyl-1,6-hexane diamine, 1,9-diamino nonane, 1,10-diamino decane, 1,12-diamino dodecane, N-methyl-1,3-propane diamine, N-ethyl-1,3-propane diamine, N-isopropyl-1,3-propane diamine, N,N-dimethyl-1,3-propane diamine, N,N'-dimethyl-1,3-propane diamine, N,N'-diethyl-1,3-propane diamine, N,N'-diisopropyl-1,3-propane diamine, N,N,N'-trimethyl-1,3-propane diamine, 2-butyl-2-ethyl-1,5-pentane diamine, N,N'-dimethyl-1,6-hexane diamine, 3,3'-diamino-N-methyl dipropyl amine, N-(3-aminopropyl)-1,3-propane diamine, spermidine, bis(hexamethylene) triamine, N,N',N''-trimethyl bis(hexamethylene) triamine, 4-aminomethyl-1,8-octane diamine, N,N'-bis(3-aminopropyl)-1,3-propane diamine, spermine, 4,4'-methylene bis(cyclohexylamine), 1,2-diamino cyclohexane, 1,4-diamino cyclohexane, 1,3-a cyclohexane bis(methylamine), 1,4-a cyclohexane bis(methylamine), 1,2-bis(aminoethoxy) ethane, 4,9-dioxa-1,12-dodecane diamine, 4,7,10-trioxa-1,13-tridecane diamine, 1,3-diamino hydroxy propane, 4,4'-methylene dipiperidine, 4-(aminomethyl) piperidine, 3-(4-aminobutyl) piperidine, and polyallylamine, but embodiments are not limited thereto.

The amount of the surfactant may be in a range of about 0.01 wt % to about 0.3 wt %, about 0.03 wt % to 0.1 wt %, or about 0.05 wt % to about 0.8 wt % based on the total amount of the hard mask composition. The amount of the reducing agent may be in a range of about 0.03 wt % to about 0.5 wt %, about 0.05 wt % to 0.4 wt %, or about 0.08 wt % to about 0.3 wt % based on the total amount of the hard mask composition. The amount of the cross-linking agent may be in a range of about 0.01 wt % to about 0.2 wt %, about 0.03 wt % to 0.15 wt %, or about 0.06 wt % to about 0.12 wt % based on the total amount of the hard mask composition.

[Method of Preparing a Hard Mask Composition]

{Preparation of Graphene Copolymer}

A graphene copolymer may be obtained by copolymerization of a graphene and an aromatic moiety.

First, functional groups may be formed on a surface of the graphene sheet in order to copolymerize the graphene sheet. FIG. 1 illustrates the process of forming functional groups on a surface of a graphene sheet 10.

Referring to FIG. 1, a graphene oxide may be formed by performing Hummers method on the graphene sheet 10. That is, functional groups containing oxygen are added to the surface and an end of the graphene sheet by using potassium permanganate and sulfuric acid. Then, the graphene sheet may be treated with hydrogen peroxide. As a result, a graphene oxide may be obtained, which has a hydroxy group on the surface and a carboxyl group on the end.

Then, the graphene oxide may be sonicated in order to separate each graphene sheet. The separated graphene sheet, for example, may be brought to react with $SOCl_2$, thereby forming an acyl chloride group (—COCl) that has a high reactivity.

The obtained graphene monomer may be brought to react with an aromatic monomer. Though it is illustrated that the graphene monomer is an acyl chloride group in FIG. 1 as an example, however, other functional groups that may be condensation-polymerized may also be applicable to the graphene sheet.

The graphene monomer and the aromatic monomer each may have a functional group as illustrated in Reaction Scheme 1, and the graphene monomer and the aromatic monomer may be condensation-polymerized so as to be bound to each other. As a result, a graphene copolymer may be obtained.

The obtained graphene copolymer may be mixed with a solvent to obtain a hard mask composition. The amount of the solvent in the hard mask composition may be in a range of about 90 wt % to about 99 wt %, as described above. A reducing agent, a surfactant, and/or a cross-linking agent may also be added depending on the situation. The amount thereof may be the same as described above.

The amount of the graphene copolymer may be in a range of about 1 wt % to about 10 wt %, about 1.3 wt % to 8.5 wt %, or about 2 wt % to about 5 wt % based on the total amount of the hard mask composition.

Figure 2:
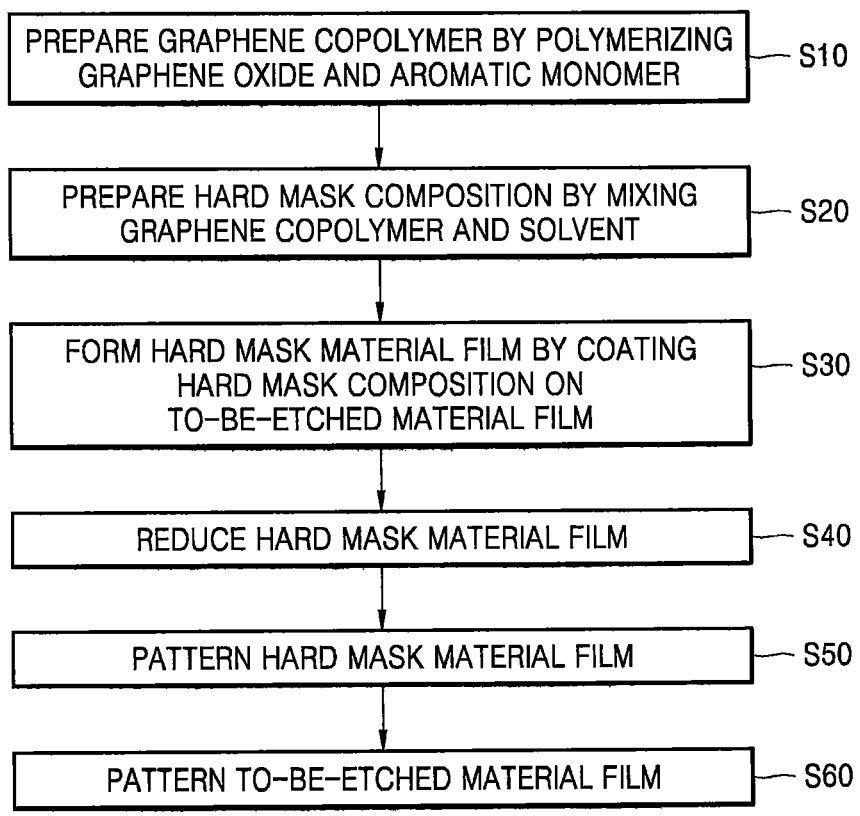
FIG. 2 is a flowchart illustrating a process from preparation of a graphene copolymer to patterning of a to be etched material.

FIG. 2 is a flowchart illustrating a process of preparation of the graphene copolymer to patterning of a to-be-etched material.

Referring to FIG. 2, a graphene oxide and an aromatic monomer may be polymerized so as to form a graphene copolymer (S10). Then, the graphene copolymer may be mixed with a solvent to prepare a hard mask composition (S20). Additional descriptions of these two operations will be omitted here, as they have already been described in detail above.

The to-be-etched material film may be coated with the hard mask composition to form a hard mask material film (S30). In particular, the hard mask material film may be coated by using spin-coating. When using a chemical vapor deposition (CVD) method to form a material film, it may be time consuming and costly; however, the hard mask material film may be formed within a short time by using spin-coating, with high throughput at low cost.

Then, the hard mask material film may be reduced (S40). When a reducing agent is added to the hard mask composition, heating the hard mask composition may be sufficient and not necessarily be performed under a reducing atmosphere. When a reducing agent is not added to the hard mask composition, reduction may be performed under a reducing atmosphere.

During the reduction process, the hard mask composition may be cross-linked by a cross-linking agent, which may improve the etching resistance of the material film.

Then, the hard mask material film may be patterned in order to obtain a hard mask pattern (S50). In addition, the lower to be etched material film may be patterned by using the hard mask pattern (S60).

The operations (S30) to (S60) will be described in detail with reference to examples.

FIGS. 3A to 3D are side cross-sectional views illustrating a method of forming a high aspect ratio contact (HARC) hole according to an exemplary embodiment.

Figure 3A:
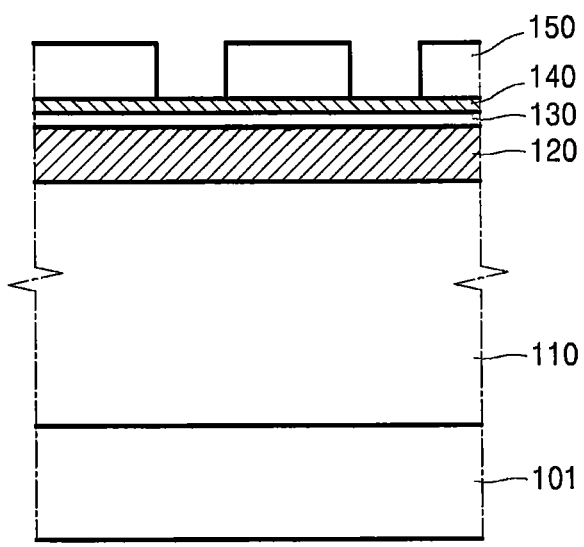
FIGS. 3A to 3D are side cross-sectional views illustrating a method of forming a high aspect ratio contact (HARC) hole according to an exemplary embodiment.

Referring to FIG. 3A, a to be etched material film 110 may be formed on a substrate 101.

The substrate 101 may include silicon (Si), for example, crystalline Si, polycrystalline Si, and amorphous Si. In some embodiments, the substrate 101 may include a semiconductor, such as germanium (Ge) or a compound semiconductor, such as silicon germanium (SiGe), silicon carbide (SiC), gallium arsenide (GaAs), indium arsenide (InAs), or indium phosphide (InP). In some embodiments, the substrate 101 may have a silicon on insulator (SOI) structure. For example, the substrate 101 may include a buried oxide layer (BOX layer). In some embodiments, the substrate 101 may include a conductive region, for example, a well doped with impurities or a structure doped with impurities.

In addition, the substrate 101 may have a semiconductor device, such as a transistor or a diode. Further, the substrate 101 may have a plurality of wirings arranged in multiple layers, and the plurality of wirings may be electrically separated by an interlayer insulation layer.

The to be etched material film 110 may be formed of a conductive film, a dielectric film, an insulating film, or a combination thereof. For example, the to be etched material film 110 may be formed of a metal, an alloy, a metal carbide, a metal nitride, a metal oxynitride, a metal oxycarbide, a semiconductor, polysilicon, an oxide, a nitride, an oxynitride, or a combination thereof, but embodiments are not limited thereto.

The to be etched material film 110 may be formed on the hard mask material film 120. The hard mask material film 120 may be formed by coating the hard mask composition on the to be etched material film 110 and by heating the hard mask composition for reduction.

Various methods may be used to coat the hard mask composition. Particularly, spin-coating may be used so as to increase throughput.

The hard mask composition, after the coating, may be heated at a temperature of about 300° C. to about 800° C. for about 10 seconds to about 5 minutes for reduction. When the hard mask composition includes a reducing agent, the heating may be performed under an arbitrary atmosphere other than an oxidizing atmosphere. Optionally, when the hard mask composition does not include a reducing agent, the heating may be performed under a reducing atmosphere.

A silicon oxynitride film 130 may be formed on the hard mask material film. The silicon oxynitride film 130 may serve as a hard mask that transfers the pattern to the hard mask material film 120, which is located below the silicon oxynitride film 130. In addition, the silicon oxynitride film 130 may serve as an anti-reflection film for an anti-reflection film 140, which is located above the silicon oxynitride film 130 when exposed to light.

For example, the silicon oxynitride film 130 may be formed to have a thickness of about 20 nm to about 100 nm by using spin-coating. Further, the silicon oxynitride film 130 may be hardened at a temperature of about 200° C. to about 250° C. in order to remove the solvent.

The anti-reflection film 140 may be formed on the silicon oxynitride film 130. The anti-reflection film 140 may prevent total reflection from occurring in the following exposure process. The material for the anti-reflection film 140 may be any common material that may be used in a photolithography process. In some embodiments, the anti-reflection film 140 may be formed of an organic anti-reflective coating (ARC) material for a KrF excimer laser, an ArF excimer laser, or any light source. The anti-reflection film 140 may be formed of an ARC material used in a dry lithography process or ARC material for an immersion lithography process. For example, the anti-reflection film 140 may be formed of at least one ARC material selected from "NCA" series and "NCST" series (commercial name purchasable from Nissan Chemical Industries, Ltd.), the "XP" series (commercial name purchasable from Rohm and Haas Electronic Materials, RHEM), the "SNSA" series (commercial name purchasable from ShinEtsu Chemical Co), etc., or a combination thereof.

In some embodiments, the anti-reflection film 140 may be an inorganic anti-reflection film or an organic anti-reflection film. The inorganic anti-reflection film may be formed of, for example, titanium, titanium dioxide, titanium nitride, chromium oxide, carbon, silicon nitride, silicon oxynitride, amorphous silicon, or a combination thereof. The organic anti-reflection film may be, for example, one formed of a condensate of a diphenylamine derivative and a formaldehyde modified melamine resin, an alkali-soluble resin, and a light-absorbing agent described in JP1995-69611B (JP-H07-69611B); a reactant of a maleic anhydride copolymer and a diamine type light-absorbing agent described in U.S. Pat. No. 5,294,680A; one containing a resin binder and a methylol melamine-based heat cross-linking agent described in JP 1994-118631A (JP-H06-118631A); an acrylic resin-type anti-reflection film having a carboxylic acid group, an epoxy group, and a light-absorbing group in the same molecule described in JP 1994-118656A (JP-H06-118656A); one formed of methylol melamine and a benzophenone-based light-absorbing agent described in JP1996-87115A (JP-H08-87115A); or one in which a low molecular weight light-absorbing agent is attached to a polyvinyl alcohol resin described in JP 1996-179509A (JP-1108-179509A). Alternatively, the organic anti-reflection film may be a commercially available organic anti-reflection film such as DUV30 Series and DUV-40 Series manufactured by Brewer Science, Inc. or AR-2, AR-3 and AR-5 manufactured by Shipley Co., Ltd. may also be used.

A photoresist pattern 150 may be formed on the anti-reflection film 140. In order to form the photoresist pattern 150, the etchable material film 110 may be coated with a photoresist composition containing a photosensitive polymer, a potential acid, or a solvent, thereby forming a photoresist film. Then, the photoresist film may undergo an exposure and development process. The coating of the photoresist composition may be spin-coating, spray coating, or deep coating.

The photoresist pattern 150 may be formed of a positive-type photoresist material. The photoresist pattern 150 may include a polymer of which the polarity increases under an action of an acid. For example, the photoresist pattern 150 may be formed of a polymer containing an acid-labile protecting group and a chemically amplified photoresist containing a potential acid.

In some embodiments, the photoresist film may be a resist for a KrF excimer laser (248 nm), a resist for an ArF excimer laser (193 nm), a resist for an $F_2$ excimer laser (157 nm), or a resist for extreme ultraviolet, (EUV) (13.5 nm).

For example, the photoresist pattern 150 may be formed of a (meth)acrylate-based polymer. The (meth)acrylate-based polymer may be an aliphatic (meth)acrylate-based polymer, for example, a polymethylmethacrylate (PMMA), a poly(t-butylmethacrylate), a poly(methacrylic acid), a poly(norbornylmethacrylate), a binary or ternary copolymer of repeating units of the (meth)acrylate-based polymers, or a combination thereof. In addition, these polymers may have a structure substituted with one of various types of acid-labile protecting groups. The acid-labile protecting group may be selected from tert-butoxycarbonyl (t-BOC), isonorbonyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl), t-buthoxycarbonylmethyl, methoxymethyl, ethoxymethyl, trimethoxysilyl, and triethoxysilyl, but embodiments are not limited thereto.

In some embodiments, the potential acid may be formed of a photoacid generator (PAG), a thermoacid generator (TAG), or a combination thereof. In some embodiments, the PAG may generate an acid upon being exposed to light selected from EUV ray (from about 1 nm to about 31 nm), an $F_2$ excimer laser (157 nm), an ArF excimer laser (193 nm), and a KrF excimer laser (248 nm). Examples of the PAG are onium salt, halogenides, nitrobenzyl esters, alkyl sulfonates, diazonaphthoquinones, iminosulfonates, disulfones, diazomethanes, and sulfonyloxy ketones.

In order to form the photoresist pattern 150, the photoresist composition may be coated on the anti-reflection film 140. Then, the photoresist composition may undergo a soft bake process at a temperature of about 90° C. to 120° C. for about 30 seconds to about 5 minutes.

Then, some part of the photoresist film may be exposed to light, thereby forming a light-exposed photoresist film having a non-light-exposed region and a light-exposed region containing acids.

The exposure may be performed by using EUV ray, an $F_2$ excimer laser (157 nm), an ArF excimer laser (193 nm), or a KrF excimer laser (248 nm). When forming micropatterns, for example, a plurality of line and space patterns having a width of several tens of nm level from the photoresist film, an EUV lithography process using EUV ray may be used. During the EUV lithography process, X-ray region or rays of wavelength of vacuum ultraviolet range, for example, a ray having a wavelength in a range of about 10 nm to about 20 nm may be used. Particularly, a ray having a wavelength of about 13.5 nm±0.3 nm may be used. When exposing the photoresist film to EUV ray, a reflecting optical system including a reflective photomask and mirrors may be used. As a result of exposing the photoresist film, generated acids from PAG and/or TAG may be found in the light-exposed region of the exposed photoresist film.

The light-exposed photoresist film may undergo a post exposure baking (PEB) process. At least due to the PEB process, acids in the light-exposed region may diffuse up to the bottom surface of the light-exposed region. In some embodiments, the PEB process may be performed at about 70° C. to about 150° C. for about 30 seconds to about 120 seconds.

Then, the light-exposed photoresist film may be developed to form the photoresist pattern 150. An alkaline aqueous solution may be used to perform the development process. For example, in order to perform the development process, tetramethylammonium hydroxide (TMAH) aqueous solution of about 2.38 wt % may be used.

Figure 3B:
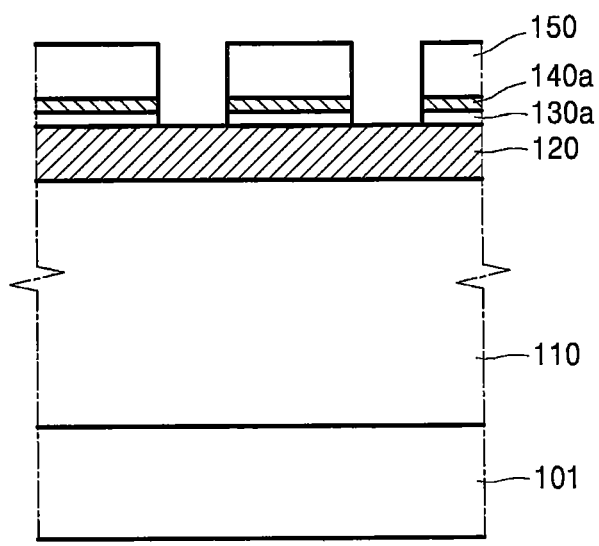

Referring to FIG. 3B, the photoresist pattern 150 may be used as an etch mask to pattern the anti-reflection film 140. When using an organic anti-reflection film as the anti-reflection film 140, patterning that removes the exposed region of the anti-reflection film 140 may be performed by using an ashing process, which employs $O_2$ as an etching agent.

After the anti-reflection film 140 is patterned, the anti-reflection film pattern 140a may be used as an etch mask so as to pattern the silicon oxynitride film 130. In order to pattern the silicon oxynitride film 130, for example, $C_xF_y$ gas or $CH_xF_y$ gas may be used as a main etching gas (where x and y are each an integer selected from 1 to 10). Alternatively, at least one gas selected from $O_2$ gas and Ar may be mixed with the main etching gas to be used. For $C_xF_y$ gas, for example, $C_3F_6$, $C_4F_6$, $C_4F_8$, or $C_5F_8$ may be used. For $CH_xF_y$ gas, for example, $CHF_3$ or $CH_2F_2$ may be used. Here, $O_2$ added to the etching gas may remove polymer by-product generated during the etching process and decompose $C_xF_y$ etching gas. In addition, Ar added to the etching gas may be used as a carrier gas and may contribute in causing ion bombarding. When etching the silicon oxynitride film 130, a plasma of an etching gas selected from the exemplified above may be formed in an etching chamber so that the etching can be performed under a plasma atmosphere. Alternatively, depending on the case, by not generating plasma in the etch chamber, etching may be performed under the selected etching gas atmosphere without ion energy. For example, a mixed gas of $C_4F_6$, $CHF_3$, $O_2$, and Ar may be used as an etching gas in order to etch the silicon oxynitride film 130. In this case, each gas may be provided such that the volume ratio of $C_4F_6$:$CHF_3$:$O_2$:Ar is about 1:6:2:14 under a pressure of about 30 mTorr, performing dry etching process of plasma method for several seconds to several tens seconds.

In FIG. 3B, it is illustrated that the photoresist pattern 150 exists, however, the process may be performed even without the photoresist pattern 150.

Figure 3C:
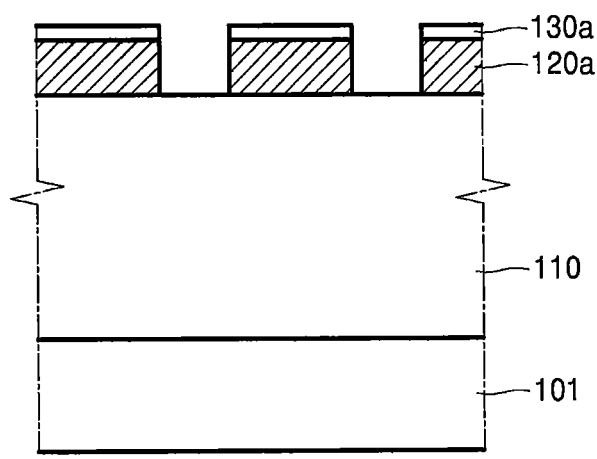

Referring to FIG. 3C, the anti-reflection film 140a may be removed, and the silicon oxynitride film 130a may be used as an etch mask so as to pattern the hard mask material film 120. As in the case of using an organic-based anti-reflection film, the hard mask material film 120 may also be partially patterned by performing ashing process, which employs $O_2$ as an etching agent.

Figure 3D:
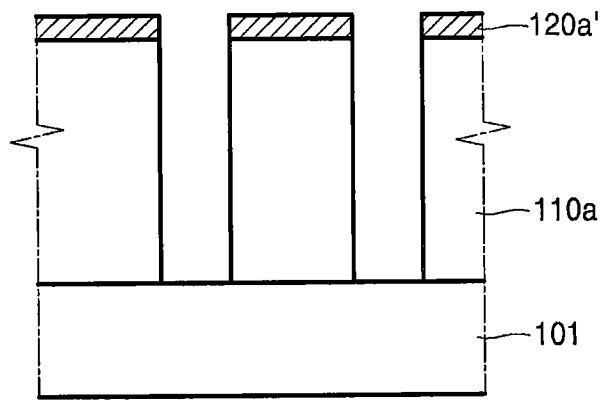

Referring to FIG. 3D, the hard mask pattern 120a may be used as an etch mask so as to etch the etchable material film 110. As described above regarding FIG. 3B, when the etchable material film 110 is formed of a silicon-based material, $C_xF_y$ gas or $CH_xF_y$ gas may be used as a main etching gas in performing etching. A description thereof will be omitted here as it has already been described in detail above.

Once the pattering of the to be etched material film 110 is completed, the hard mask pattern 120a' may be removed so as to obtain a patterned material film 110a. The hard mask pattern 120a' is formed of a carbon-based material, and thus, the hard mask pattern 120a' may be more readily removed by using methods, such as an ashing and/or stripping process. The aspect ratio of an opening of the patterned etchable material film 110a may be in a range of about 20 to about 70.

The opening may be a contact hole to form a capacitor, which connects to a switching device formed on the substrate 101.

{VNAND}

Figure 4A:
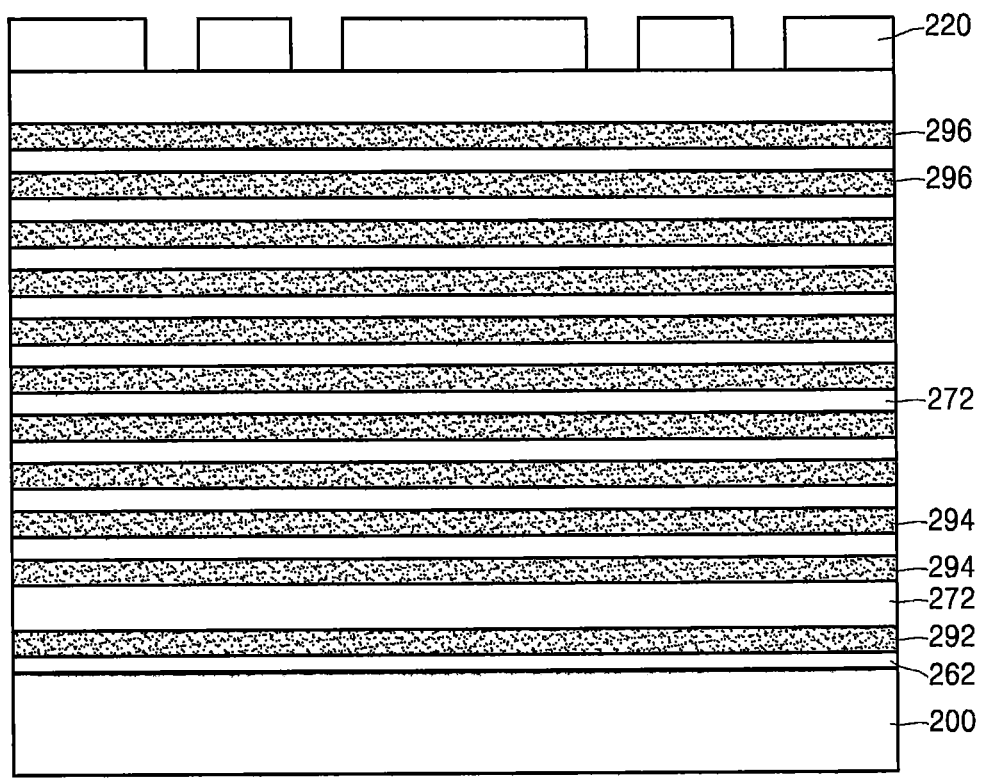
FIGS. 4A and 4B are cross-sectional views illustrating a method of fabricating a vertical semiconductor apparatus according to an exemplary embodiment.
Figure 4B:
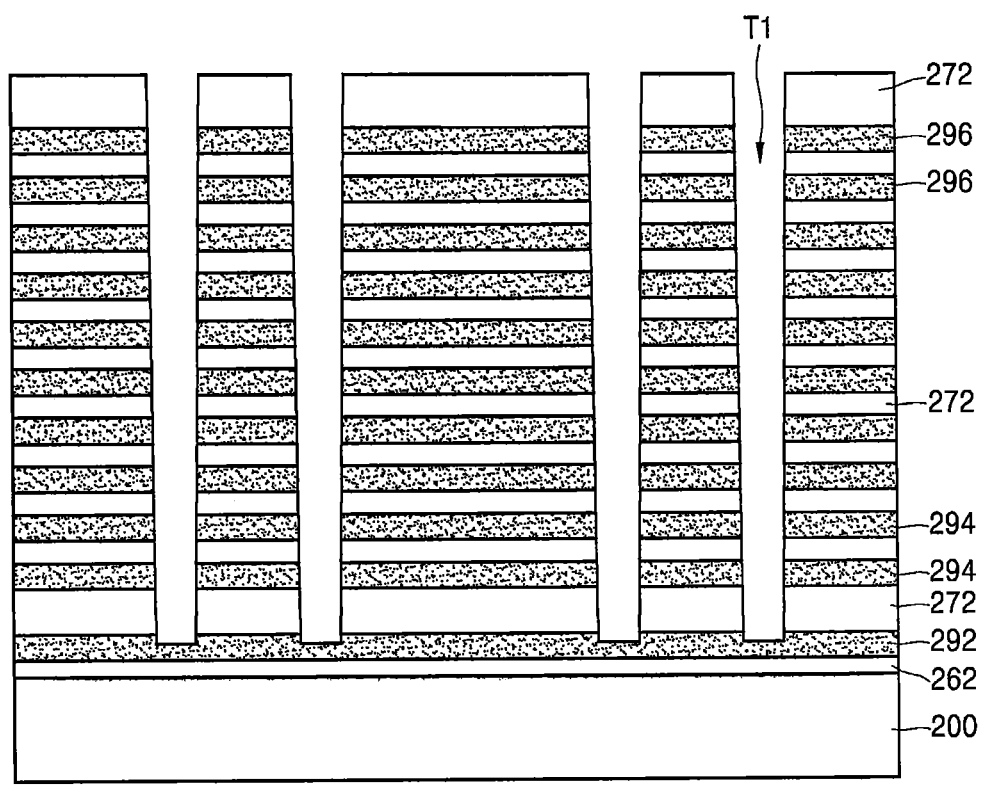

FIGS. 4A and 4B are cross-sectional views illustrating a method of fabricating a vertical semiconductor apparatus according to an exemplary embodiment.

Referring to FIG. 4A, a first etch stop film 262 may be formed on a substrate 200, and a first sacrificial layer 292 may be formed on the first etch stop film 262. First insulating layers 272 and second sacrificial layers 294 may be alternately stacked on the first sacrificial layer 292. The first insulating layers 272 and third sacrificial layers 296 may be alternately stacked on a top surface of the second sacrificial layer 294.

In some embodiments, the first etch stop film 262 may be formed using an insulating material, such as a silicon oxide, a silicon nitride, or a silicon oxynitride. The material of the first etch stop film 262 is not limited thereto, however, as long as the material has an etch selectivity with respect to the first sacrificial layer 292 and/or substrate 200, the material may be included therein. Further, the first insulating layers 272 may be formed using a silicon oxide, a silicon nitride, or a silicon oxynitride. In some embodiments, the first to third sacrificial layers 292, 294, 296 may be formed of a conductive material doped with impurities, such as polysilicon. Thicknesses and/or interval of the first to third sacrificial layers 292, 294, 296 may be formed differently.

Then, the hard mask material film 220 may be formed on a top surface of a layer that locates uppermost. The method of forming the hard mask material film 220 has already been described above referring to FIG. 3A, and thus the descriptions thereof will not be repeated here.

Referring to FIG. 4B, the hard mask material film 220 may be used as an etch mask so as to perform an anisotropic etch upon the first insulating layers 272 and the first to third sacrificial layers 292, 294, 296, thereby forming an opening T1.

The opening T1 may serve as a channel hole for forming a vertical NAND memory apparatus. Further, the opening T1 may have an aspect ratio of about 20 to about 70.

Figure 5:
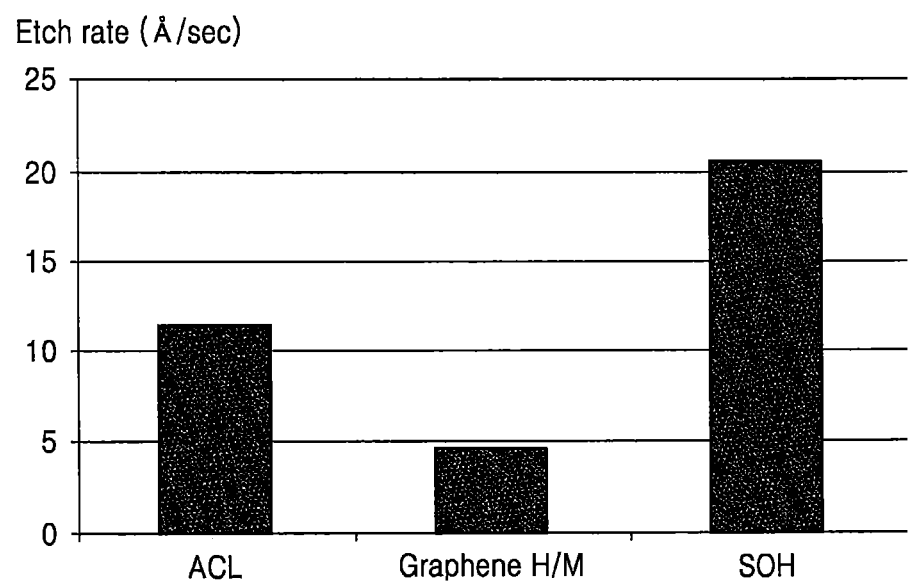
FIG. 5 illustrates a graph showing a result of etching tolerance tests performed on a hard mask according to an exemplary embodiment and hard masks according to the conventional art.

FIG. 5 illustrates a graph showing a result of etching resistance tests performed using different carbon-based layers formed on substrates under the same etching conditions.

A spin-on hard mask layer according to the conventional art (SOH), a hard mask layer using a CVD method according to the related art (ACL), and a graphene copolymer hard mask layer according to an exemplary embodiment (Graphene H/M) were formed on silicon substrates. Also, the layers were etched with $CF_4$ plasma with the same power. By measuring the thicknesses of layers before etching, and after etching and calculating the etch depth per unit time, which is obtained by dividing etch depth by an etching time, a graph as shown in FIG. 5 was obtained.

As shown in FIG. 5, the spin-on hard mask layer was removed at a rate of about 20.5 angstrom (Å) per second, and the hard mask layer using the chemical vapor deposition method was removed at a rate of about 11.5 Å per second. However, the graphene copolymer hard mask layer was removed at a rate of 4.5 Å per second, showing excellent etching resistance.

The hard mask composition according to an exemplary embodiment has an improved etching resistance, and thus, etching with an increased aspect ratio may also be performed on a mask having a small thickness. As the hard mask having a smaller thickness may be sufficient to be used, it is advantageous, in terms of key alignment at least due to sufficient transparency and it is economical at least due to less material cost.

Figure 6:
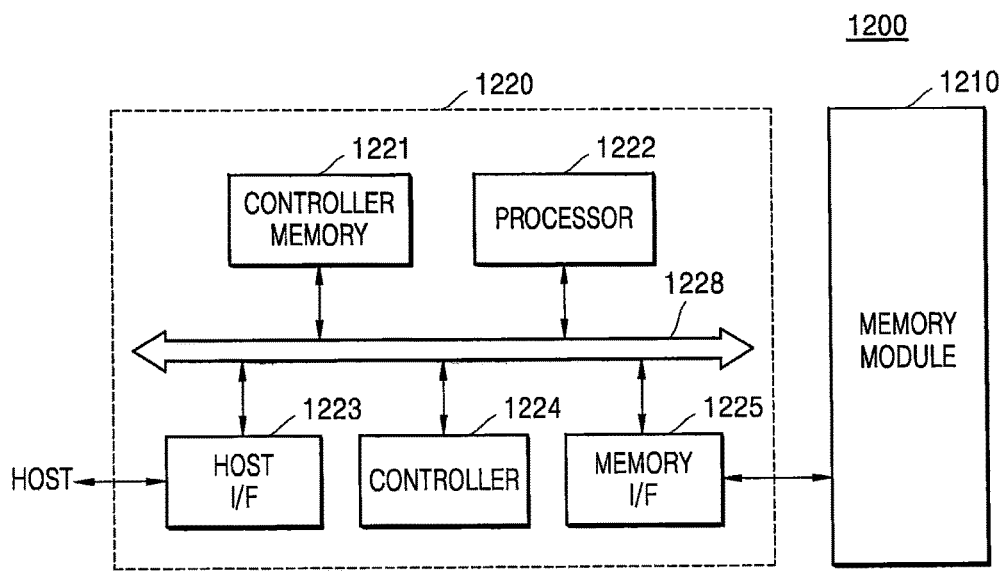
FIG. 6 is a block diagram of a memory card including an integrated circuit (IC) device, according to an exemplary embodiment.

FIG. 6 is a block diagram of a memory card 1200 including an integrated circuit (IC) device, according to an exemplary embodiment.

The memory card 1200 includes a memory controller 1220 for generating command and address (C/A) signals, and a memory module 1210, such as a flash memory including at least one flash memory device. The memory controller 1220 includes a host interface 1223 for transmitting or receiving the C/A signals to or from a host, and a memory interface 1225 for transmitting or receiving the C/A signals to or from the memory module 1210. The host interface 1223, a controller 1224, and the memory interface 1225 communicate via a common bus 1228 with a controller memory 1221, e.g., static random-access memory (SRAM), and a processor 1222, e.g., a central processing unit (CPU).

The memory module 1210 receives the C/A signals from the memory controller 1220, and, as a response, stores or searches for data in at least one of the memory devices of the memory module 1210. Each memory device includes a plurality of addressable memory cells and a decoder for receiving the C/A signals and generating row and column signals to access at least one of the addressable memory cells in programming and reading operations.

At least one of the components of the memory card 1200, e.g., the electronic devices (1221, 1222, 1223, 1224, and 1225) included in the memory controller 1220, and the memory module 1210, may include an IC device according to an exemplary embodiment.

Figure 7:
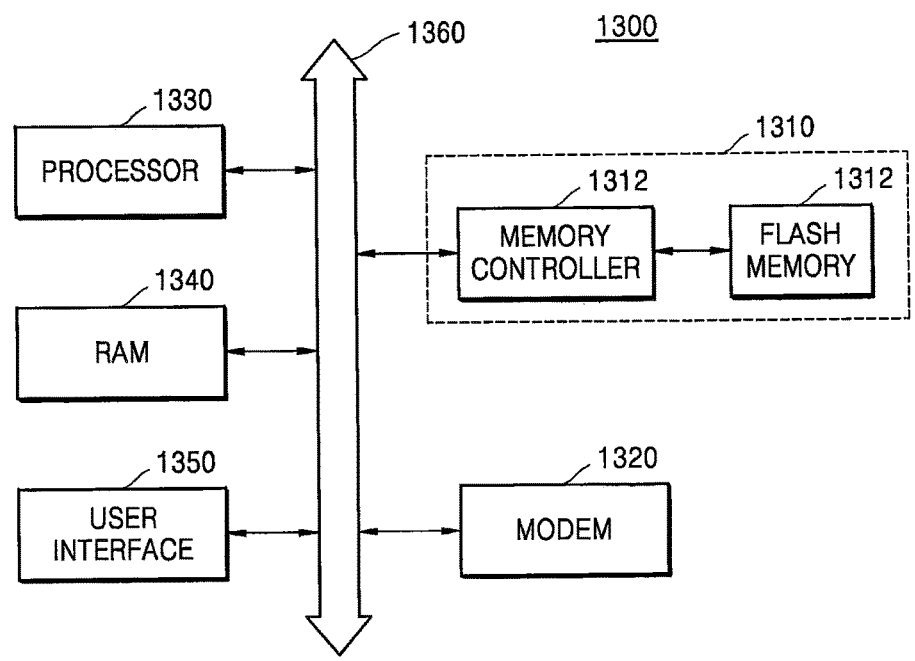
FIG. 7 is a block diagram of a memory system employing a memory card including an IC device, according to an exemplary embodiment.

FIG. 7 is a block diagram of a memory system 1300 adopting a memory card 1310 having the IC device prepared by the patterning, according to an exemplary embodiment.

Referring to FIG. 7, the memory system 1300 includes a processor 1330, such as a CPU, a random access memory (RAM) 1340, a user interface 1350, and a modem 1320, which communicate via a common bus 1360. Each device transmits a signal to the memory card 1310 and receives a signal from the memory card 1310, via the bus 1360. At least one constituent part of the memory system 1300 including the processor 1330, the RAM 1340, the user interface 1350, and the modem 1320, with the memory card 1310, may include the IC device formed by the patterning method according to the above-described exemplary embodiments.

The memory system 1300 may be applied to a variety of applied fields of electronics. For example, solid state drives (SSDs), CMOS image sensors (CISs), and computer application chip sets.

The memory systems and devices disclosed in the present specifications may be packaged in the form of one of various device package forms including a ball grid array (BGA), a chip scale package (CSP), a plastic leaded chip carrier (PLCC), a plastic dual in-line package (PDIP), a multi-chip package (MCP), a wafer-level fabricated package (WFP), or a wafer-level processed stock package (WSP). However, the embodiments are not limited thereto.

While the inventive concept has been particularly shown and described with reference to exemplary embodiments thereof, it will be understood by those of ordinary skill in the art that various changes in form and details may be made without departing from the spirit and scope of the inventive concept as set forth in the following claims. Therefore, changes of embodiments will be departing from the technology of the inventive concept.

What is claimed is:

1. A hard mask composition for spin coating comprising:
   a graphene copolymer;
   a solvent; and
   a reducing agent selected from the group consisting of a boron hydride metal salt, an aluminum hydride, a $C_2$ to $C_6$ glycol, an alkanolamine, an aliphatic amine, a heterocyclic amine, an aromatic amine, an aralkyl amine, an organic acid, a reducing sugar, methanol, 2-propanol, a sugar alcohol, a hydrazine compound, a sulfite, a glutathione, dextrin, and a hydroquinone,
   wherein the graphene copolymer comprises a graphene repeating unit and an aromatic repeating unit, and wherein the graphene copolymer comprises a structure of Formula 1:

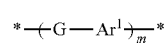

<Formula 1> wherein, G indicates a graphene repeating unit, $Ar^1$ indicates an aromatic repeating unit, and m is an integer of about 10 to about 10000.

2. The hard mask composition of claim 1, wherein the aromatic repeating unit is selected from at least one of a pyrene derivative, a naphthalene derivative, an anthracene derivative, a phenanthrene derivative, a fluorene derivative, a phthalic anhydride derivative, a naphthacene derivative, a fluoanthracene derivative, a tetraphene derivative, a perylene derivative, a chrysene derivative, a dibenzoanthracene derivative, a pentaphene derivative, a coronene derivative, a pentacene derivative, a hexacene derivative, an antanthrene derivative, an ovalene derivative, a pyranthrene derivative, an acenaphthene derivative, an acenaphthylene derivative, a fluoranthene derivative, a fluoranthene derivative, and a triphenylene derivative.

3. The hard mask composition of claim 1, wherein the graphene copolymer comprises at least one bond selected from an ester group, an amide group, a urethane group (—NHCOO—), a urea group (—NHCONH—), an imide group, and a hydroxyether group.

4. The hard mask composition of claim 1, further comprising a cross-linking agent.

5. The hard mask composition of claim 4, wherein the cross-linking agent is selected from an isocyanate cross-linking agent, a peroxide cross-linking agent, an epoxy cross-linking agent, and an amine cross-linking agent.

6. The hard mask composition of claim 1, wherein the solvent is selected from propylene glycol monomethyl ether acetate (PGMEA), propylene glycol monomethyl ether (PGME), propylene glycol propyl ether (PGPE), cyclohexanone, N-methyl-2-pyrrolidone (NMP), γ-butyrolactone (GBL), 2-hydroxyisobutyric acid methylester (HBM), dimethyl sulfoxide (DMSO), and ethyl lactate (EL).

7. The hard mask composition of claim 1, wherein the graphene copolymer further comprises a surfactant.

8. The hard mask composition of claim 1, wherein the reducing agent is selected from the group consisting of sodium boron hydride, lithium aluminum hydride, potassium aluminum hydride, cesium aluminum hydride, beryllium aluminum hydride, magnesium aluminum hydride, calcium aluminum hydride, ethylene glycol, diethylaminoethanol, ethanol amine, propanol amine, triethanol amine, dimethylaminopropanol, propylamine, butylamine, dipropyleneamine, ethylenediamine, triethylenepentamine, piperidine, pyrrolidine, N-methylpyrrolidine, morpholine, aniline, N-methyl aniline, toluidine, anisidine, phenetidine, benzylamine, xylenediamine, N-methylbenzylamine, methanol, 2-propanol, citric acid, malic acid, succinic acid, oxalic acid, tartaric acid, glucose, galactose, mannose, fructose, sucrose, maltose, raffinose, stachyose, sorbitol, sulfite, glutathione, dextrin, and hydroquinone.

9. A hard mask composition for spin coating comprising:
a graphene copolymer;
a solvent; and
a reducing agent selected from the group consisting of a boron hydride metal salt, an aluminum hydride, a $C_2$ to $C_6$ glycol, an alkanolamine, an aliphatic amine, a heterocyclic amine, an aromatic amine, an aralkyl amine, an organic acid, a reducing sugar, methanol, 2-propanol, a sugar alcohol, a hydrazine compound, a sulfite, a glutathione, dextrin, and a hydroquinone,
wherein the graphene copolymer comprises a graphene repeating unit and an aromatic repeating unit and at least two aromatic repeating units are present between two graphene repeating units in the graphene copolymer.

10. The hard mask composition of claim 9, wherein the graphene copolymer comprises a structure of Formula 2:

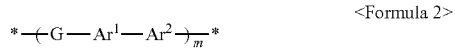
<Formula 2> wherein, G indicates the graphene repeating unit, $Ar^1$ and $Ar^2$ each indicate the aromatic repeating unit, and m is an integer of about 10 to about 10000.

11. A hard mask composition for spin coating comprising:
a graphene copolymer;
a solvent; and
a reducing agent selected from the group consisting of a boron hydride metal salt, an aluminum hydride, a $C_2$ to $C_6$ glycol, an alkanolamine, an aliphatic amine, a heterocyclic amine, an aromatic amine, an aralkyl amine, an organic acid, a reducing sugar, methanol, 2-propanol, a sugar alcohol, a hydrazine compound, a sulfite, a glutathione, dextrin, and a hydroquinone,
wherein the graphene copolymer comprises a graphene repeating unit and an aromatic repeating unit and the graphene copolymer is a condensation polymerization product of a first monomer comprising the graphene repeating unit and a second monomer comprising the aromatic repeating unit.

* * * * *